United States Patent
Choi

(10) Patent No.: US 8,419,891 B2
(45) Date of Patent: Apr. 16, 2013

(54) SEMICONDUCTOR DEVELOPMENT APPARATUS AND METHOD USING SAME

(75) Inventor: Dug-Kyu Choi, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1168 days.

(21) Appl. No.: 11/605,976

(22) Filed: Nov. 30, 2006

(65) Prior Publication Data

US 2007/0187037 A1 Aug. 16, 2007

(30) Foreign Application Priority Data

Feb. 16, 2006 (KR) .......................... 10-2006-0015335

(51) Int. Cl.
*C23F 1/00* (2006.01)
*H01L 21/306* (2006.01)

(52) U.S. Cl.
USPC ............ 156/345.21; 156/345.11; 156/345.17; 156/345.18

(58) Field of Classification Search ............. 156/345.21, 156/345.11, 345.17, 345.18
See application file for complete search history.

(56) References Cited

U.S. PATENT DOCUMENTS

| | | | |
|---|---|---|---|
| 6,669,809 B2 * | 12/2003 | Hashimoto et al. | 156/345.2 |
| 6,712,926 B2 * | 3/2004 | Chiang et al. | 156/345.18 |
| 2007/0187037 A1 * | 8/2007 | Choi | 156/345.11 |

FOREIGN PATENT DOCUMENTS

| | | | |
|---|---|---|---|
| JP | 8124846 | * | 5/1996 |
| JP | 2000331974 A | | 11/2000 |
| KR | 1020000032053 | | 6/2000 |
| KR | 1020000033763 | | 6/2000 |
| KR | 1020000050312 A | | 8/2000 |
| KR | 1020000065606 | | 11/2000 |

OTHER PUBLICATIONS

Machine Generated English Translation of KR 1020000050312. published Aug. 5, 2000.*

* cited by examiner

*Primary Examiner* — Sylvia R. MacArthur
(74) *Attorney, Agent, or Firm* — Volentine & Whitt, PLLC

(57) ABSTRACT

A knife edge ring apparatus is provided for use during semiconductor manufacturing which includes a ring-shaped body having an inner side wall, an outer side wall and a top surface having a predetermined width. A multi-staged inclined portion is formed in the outer side wall and a plurality of discharge holes penetrate the body. Each of the discharge holes have an inlet associated therewith positioned at the inclined portion. The knife edge ring allows developer and cleaning solution to be discharged away from the wafer. A method of cleaning the bottom surface of a semiconductor wafer is also provided which employs the use of the knife edge ring. Developer is supplied onto the top surface of a wafer. Spraying solution is sprayed onto the bottom surface of the wafer. The knife edge ring guides the developer and the cleaning solution remaining on the bottom surface of the wafer's edge along an inclined portion formed at an outer side wall of the knife edge ring and causes the developer and the cleaning solution to flow into a plurality of discharge holes.

7 Claims, 4 Drawing Sheets

SEMICONDUCTOR DEVELOPMENT APPARATUS AND METHOD USING SAME

BACKGROUND OF INVENTION

1. Field of the Invention

The present invention relates to a semiconductor development apparatus and more particularly to a knife edge ring capable of easily discharging developer and cleaning solution remaining on a bottom surface of a wafer during semiconductor manufacturing.

This application claims priority from Korean Patent Application No. 10-2006-0015335, filed Feb. 16, 2006, the disclosure of which is hereby incorporated herein by reference in its entirety as if set forth fully herein.

2. Discussion of Related Art

Semiconductor devices are manufactured by repeatedly performing various processes such as diffusion, oxidation, deposition, photolithography and cleaning. In the photolithography process, a photosensitive film made of a photoresist is coated on the wafer with a predetermined thickness, the wafer is exposed to light using a reticle in which a desired pattern is designed, and the exposed photosensitive film is removed through a developing process. During this developing process, a wafer to be exposed is rotated at a constant speed while a predetermined amount of developer is supplied on the wafer. A cleaning solution is then supplied to the bottom surface of the rotating wafer. The wafer is then withdrawn and mounted on a top surface of a bake plate and baked at a predetermined temperature.

As the developer is supplied to the upper surface of the rotating wafer, the developer moves toward the edge by centrifugal force and some of the developer forms a liquid droplet on the wafer's bottom surface. In addition, the cleaning solution directed to the wafer's bottom surface may not be entirely discharged. This remaining solution may form another liquid droplet toward the edge of the wafer's bottom surface. When these droplets combine to form a large size droplet, this droplet may remain on the edge of the wafer's bottom surface. When the wafer undergoes the baking process, this large liquid droplet migrates toward the side of the wafer and is vaporized. This vaporization causes chemical material to deposit at the periphery of the top surface of the edge of the wafer. This chemical material acts as a contaminant and compromises circuit patterning at the wafer's edge. This results in product loss due to a reduction in the amount of useable wafer.

SUMMARY OF THE INVENTION

The present invention provides a knife edge ring capable of easily discharging a liquid droplet of a developer and a cleaning solution remaining on a bottom surface of a wafer's edge during semiconductor wafer processing. The knife edge ring includes a body positioned a predetermined distance from the bottom surface of the wafer. The body is defined by an inner side wall, an outer side wall and a top surface having a predetermined width. A multi-stage inclined portion is formed in the outer side wall of the body. A plurality of discharge holes, each having an inlet, penetrate the ring body where each of these holes has an inlet positioned along the inclined portion. The present invention also provides for a semiconductor development apparatus and method of cleaning the bottom surface of a semiconductor wafer utilizing the knife edge ring.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DESCRIPTION OF EMBODIMENTS

Figure 1:
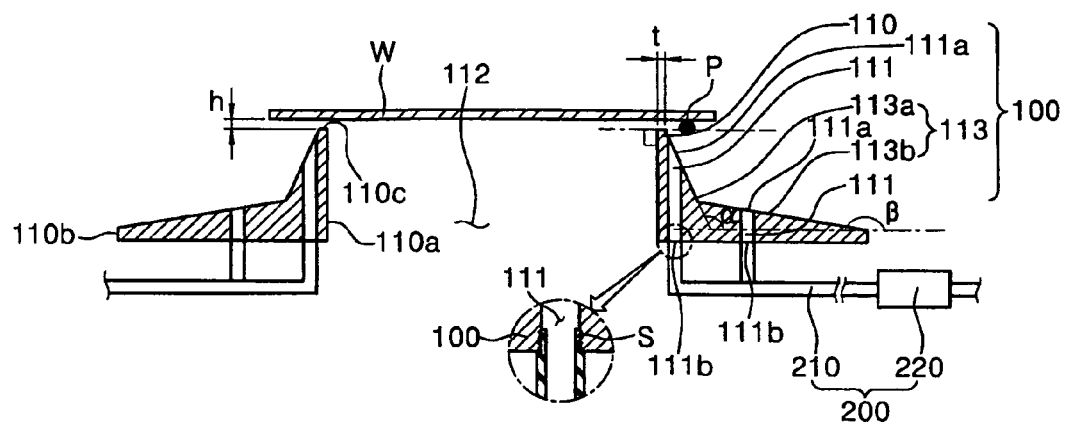
FIG. 1 is a sectional view illustrating a knife edge ring according to an embodiment of the present invention.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

FIG. 1 is a sectional view illustrating a knife edge ring according to an embodiment of the present invention. Knife edge ring 100 includes a ring-shaped body 110 spaced a predetermined distance "h" from a bottom surface of a wafer W. Body 110 includes an inner side wall 110a and an outer side wall 110b and a plurality of discharge holes 111 formed through body 110. A multi-stage inclined portion 113 is formed in the outer side wall 110b and inlets 111a communicate with discharge holes 111 formed in inclined portion 113. Outlets 111b are formed at a bottom surface of body 110 and are configured to allow fluid inside holes 111 to be discharged. The above-described inner side wall 110a is an inner wall of a center hole 112 of body 110.

Multi-stage inclined portion 113 is comprised of a first inclined portion 113a and a second inclined portion 113b connected to first inclined portion 113a, from an upper portion of outer side wall 110b. The first inclined portion 113a is steeper than the second inclined portion 113b ($\beta > \alpha$). Furthermore, the angle of inclination ($\alpha$, $\beta$) of the first and second inclined portions 113a and 113b is an obtuse angle with respect to the bottom surface of body 110 and may be, for example, 150° to 170°.

In a top surface 110c of body 110, the width "t" of a connection between the inner side wall 110a and the outer side wall 110b may be, for example, 0.1 to 0.5 mm. The inner side wall 110a and the top surface of body 110 may be maintained at right angles with respect to each other. Alternatively, a corner at which the inner side wall 110a and the top surface intersect may be tapered to form an inclined surface. The discharge hole 111 is formed in body 110 to penetrate therethrough which may be connected to a vacuum suction unit 200 which includes a tube 210 coupled to outlets 111b formed on the bottom surface of body 110 and a vacuum pump 220 connected to an end of tube 210.

A photoresist (not shown) is applied on a top surface of wafer W, but is also guided to a bottom surface of wafer W at its edge portion causing a liquid droplet to form on the bottom surface. A cleaning solution is directed to the bottom surface of the edge of wafer under a predetermined spraying pressure. However, the cleaning solution may not be entirely discharged from the bottom surface of the wafer and another liquid droplet may form at the wafer's edge through a space between the bottom surface of the edge of the wafer W and the top surface 110c of body 110. Thus, two liquid droplets composed of the cleaning solution and a developer combine to form a large-sized liquid droplet "P".

When the liquid droplet P drops from the bottom surface of wafer W, it drops toward the inclined portion 113 of body 110. The droplet is guided by the first inclined portion 113a and flows into inlet 111a of discharge hole 111 and can be easily discharged outside of body 110 through outlet 111b formed on the bottom surface of body 110. The inclined portion 113 formed at the outer side wall 110b of body 110 is composed of a multi-stage inclined portion. In particular, inclined portions 113a and 113b define an angles of inclination ($\alpha$, $\beta$). These angles are obtuse angles such that liquid droplet P flows fast along first inclined portion 113a disposed underneath the bottom surface of the edge of wafer W and enters inlet 111a. If the remaining liquid droplet P does not enter inlet 111a of first inclined portion 113a, the droplet is guided to second inclined portion 113b and flows into inlet 111b formed in second inclined portion 113b. In this manner, the liquid droplet P is easily discharged outside of body 110 through discharge holes 111.

A vacuum suction unit 200 is connected to discharge holes 111. As the liquid droplet P flows into discharge hole 111, a suction force from pump 220 is generated inside discharge hole 111 via tube 210 and the droplet is discharged away from wafer W. Additionally, when the liquid droplet P remains at the periphery of the inclined portion 113, vacuum suction unit 200 supplies a suction force to discharge hole 111 sufficient to pull the droplet into inlet 111a. Thus, even if a liquid droplet P dropped from the bottom surface of the edge of wafer W flows along inclined portion 113, but does not enter an inlet, the liquid droplet P remaining on the inclined surface of inclined portion 113 is pulled into inlet 111a through the use of vacuum suction unit 200 and discharged externally. In this manner, it is possible to clean the bottom surface of the edge of wafer W and at the same time clean the outer side wall 111b of the knife edge ring.

Figure 2:
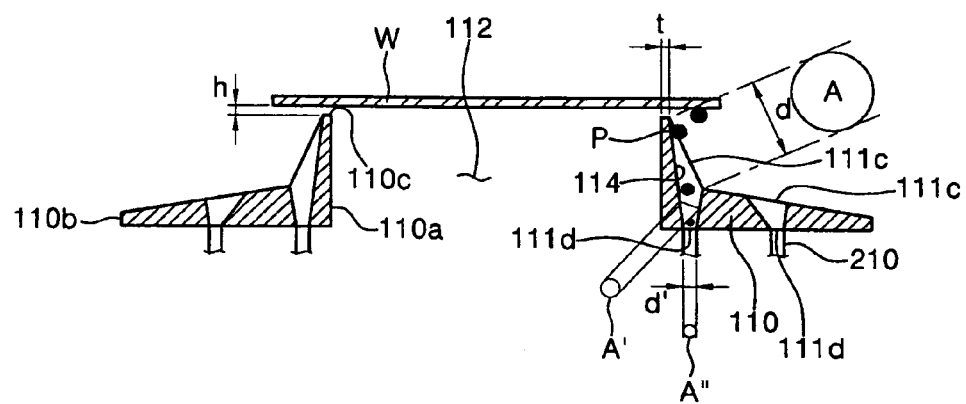
FIG. 2 is a sectional view illustrating the knife edge ring according to an embodiment of the present invention.

FIG. 2 is a sectional view illustrating the knife edge ring according to an alternative embodiment of the present invention. The knife edge ring includes a body 110 having an inner side wall 110a and an outer side wall 110b, and a discharge hole 111 formed to penetrate through body 110. A multi-stage inclined portion 113 is formed at the outer side wall 110b of body 110. An inlet 111c of the discharge hole 111 may be positioned at inclined portion 113. An outlet 111d of discharge hole 111 may be positioned at a bottom surface or a side portion of body 110. A sectional area A of inlet 111a is larger than a sectional area A' of outlet 111d where the diameter d of inlet 111a is larger than the diameter d' of outlet 111b. A flow channel inside discharge hole 111 may be formed such that it is spaced from inner side wall 110a from the top surface 110c of inclined portion 113 toward the lower side of body 110.

Figure 3:
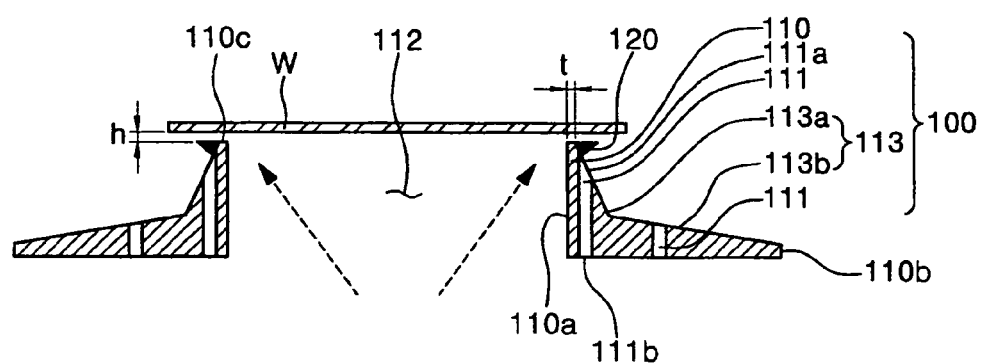
FIG. 3 is a sectional view illustrating the knife edge ring according to an embodiment of the present invention.

FIG. 3 is a sectional view illustrating a knife edge ring according to an alternative embodiment of the present invention in which a protrusion 120 is formed at outer side wall 110b of body 110. Protrusion 120 extends from the top surface 110c of body 110 and includes an inclined surface extending from a distal end into body 110 along the lower side of body 110 and may also be provided at outer side wall 110b.

It is preferable that the total length of the top surface of the extending protrusion 120 and body 110 is, for example, 0.5 mm or less. The remaining structure of body 110 is similar to that described with reference to FIG. 1 or 2.

In operation, a droplet formed from the developer and a droplet formed from the cleaning solution on the bottom surface of the edge of wafer W combines to form a droplet P which drops toward inclined portion 113 by its own weight. The dropped liquid droplet P flows toward the lower side of body 110 along the surface of inclined portion 113. Liquid droplet P flows into inlet 111c and into discharge hole 111. The cross sectional area A of inlet 111c is larger than the cross sectional area A' of discharge hole 111 such that liquid droplet P can easily flow into inlet 111c. If liquid droplet P is larger than a predetermined amount, the droplet can be guided into inlet 111c. If a vacuum suction is provided to discharge hole 111 from a vacuum suction unit 200 as shown in FIG. 1, liquid droplet P which has flowed into the discharge hole 111 is easily discharged externally by the suction force generated in discharge hole 111. If the liquid droplet P remains at the inclined portion 113 around inlet 111c, the suction force from unit 200 pulls the droplet P into the discharge hole 111. The vacuum suction force applied to discharge hole 111 is also applied to the bottom surface of the edge of wafer W through inlet 111c so that it is possible to forcedly pull liquid droplet P and discharge it externally through discharge hole 111. Additionally, when liquid droplet P flows or is pulled into discharge hole 111, it is guided while contacting the inclined surface of protrusion 120 so that the liquid droplet P is easily guided into inlet 111a through inclined portion 113 without splashing on the top surface of inclined portion 113.

Figure 4:
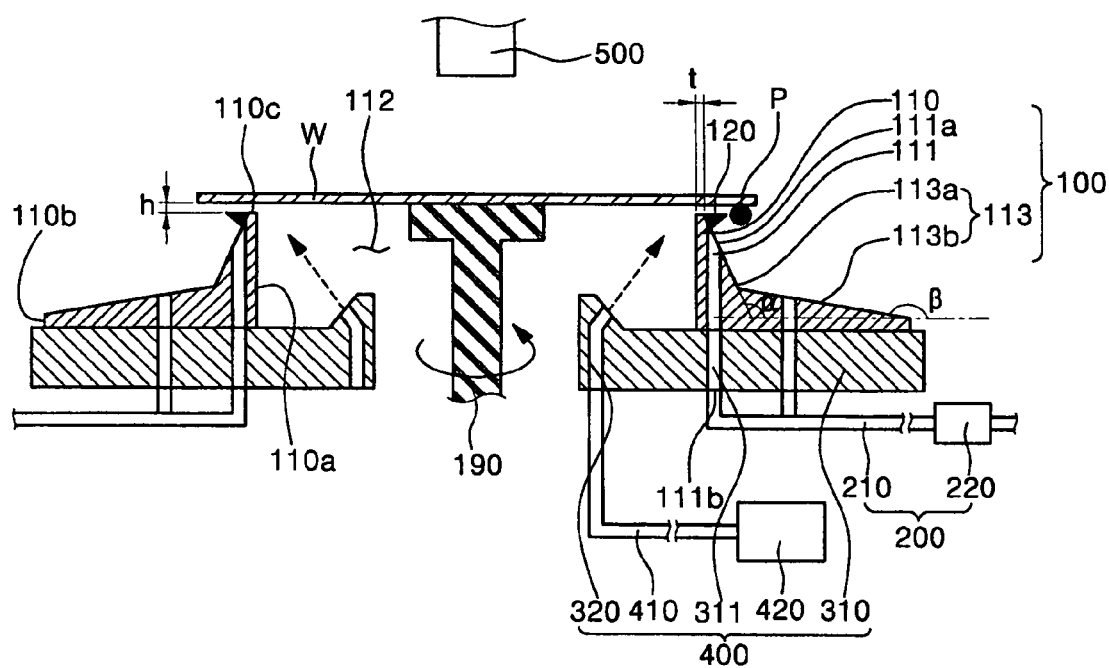
FIG. 4 is a sectional view illustrating a semiconductor development apparatus according to the present invention.

FIG. 4 is a sectional view illustrating a semiconductor development apparatus in accordance with the present invention which includes a chuck 190, a developer supply unit 500 and a knife edge ring 100. Chuck 190 supports a central bottom surface of wafer W and rotates the wafer at a constant speed. Developer supply unit 500 is disposed at the upper side of chuck 190 and supplies a predetermined amount of developer toward the top surface of wafer W. Knife edge ring 100 is positioned to surround the periphery of chuck 190 and is disposed adjacent to the bottom surface of wafer W a predetermined distance. A cleaning solution spraying unit 400 is positioned to provide cleaning solution such as pure water toward the bottom surface of wafer W through spraying holes 320.

Knife edge ring 100 is comprised of a body 110 having inner and outer side walls 110a and 110b and a top surface 110c having a width of, for example, 0.1 mm to 0.5 mm. A multi-stage inclined portion 113 is provided in body 110 at outer side wall 110b thereof. Each of the discharge holes 111 extends through body 110 and inlet 111a is positioned at inclined portions 113a and 113b. The cross sectional area A of inlet 111a may be larger than the cross sectional area A' of discharge hole 111. The angle measured between the bottom surface of body 110 and inclined portions 113a and 113b may be an obtuse angle from, for example, 150° to 170°. Discharge hole 111 is connected to vacuum suction unit 200 for forcedly discharging liquid droplet P formed from the developer and the cleaning solution introduced thereto through inlet 111a. Furthermore, a protrusion 120, which extends from the top surface 110c of body 110 and includes an inclined surface inclined from an extending distal end into body 110 along the lower side of body 110, may be further provided at the outer side wall 110b. It is preferable that the total length of the top surface of extending protrusion 120 and body 110 is, for example, 0.5 mm or less. When liquid droplet P formed on the bottom surface of the edge of wafer W flows or is pulled into discharge hole 111, it is guided while contacting the inclined surface of protrusion 120 so that the liquid droplet P can be easily guided into inlet 111a through inclined portion 113 without splashing the top surface of inclined portion 113.

The cleaning solution spraying unit 400 includes an inner cup 310 supporting the knife edge ring 100, a plurality of spraying holes 320 formed in the inner cup 310, and a cleaning solution supply unit 420 which is connected to spraying holes 320 to supply the cleaning solution thereto. The cleaning solution supply unit 420 is connected to the spraying hole 320 through a tube 410. A plurality of holes 311 penetrates inner cup 310 which is connected to discharge holes 111 extending through body 110. Holes 311 are connected to tube 210 of vacuum suction unit 200. A spraying direction of each of the plurality of spraying holes 320 has a predetermined angle of inclination to direct cleaning solution to the bottom surface of the edge of wafer W.

In operation, wafer W is mounted on chuck 190 which rotates at a constant rotational speed. The developer supply unit 500 supplies a predetermined amount of developer to the top surface of wafer W. The developer supplied to the top surface of wafer W is applied onto the top surface of wafer W to remove a photoresist on wafer W and is discharged through the side portion of wafer W. The application of the developer to the wafer may cause a liquid droplet having a predetermined size to form on the bottom surface of the wafer's edge. A cleaning solution spraying unit 400 is used to direct cleaning solution to the bottom surface of wafer W through spraying hole 320 under a predetermined spraying pressure. The cleaning solution contacts the bottom surface of wafer W and is discharged to the outside of body 110 through the top surface 110c. A portion of the cleaning solution may combine with the developer liquid droplet to form a larger-sized liquid droplet P on the bottom surface of the edge of wafer W. The liquid droplet P may drop toward the inclined portion 113 of body 110 by its own weight and may flow toward the lower side of body 110 through inclined portion 113. The liquid droplet P flows along inclined portion 113 and is guided into discharge hole 111 via inlet 111a and is discharged externally through outlet 111b. Any remaining portion of liquid droplet P that did not enter inlet 111a is guided into inlet 111a of second inclined portion 113b and is also discharged externally through discharge hole 111.

Liquid droplet P may also be pulled through discharge hole 111 by utilizing a vacuum suction force from vacuum suction unit 200. In particular, vacuum pump 220 applies a vacuum suction force to discharge hole 111 via tube 210. The vacuum suction force is applied to discharge hole 111 such that the liquid droplet P formed on the bottom surface of the edge of the wafer W is pulled into inlet 111a before it drops therein by its own weight. As a result, the liquid droplet can be forced to flow into discharge hole 111 and can be easily discharged externally from wafer W.

Alternatively, when the liquid droplet P formed on the bottom surface of the edge of wafer W flows or is pulled into discharge hole 111, it is guided while contacting the inclined portion of protrusion 120, whereby the liquid droplet P is easily guided into inlet 111a through inclined portion 113 without splashing the top surface of inclined portion 113.

Figure 5:
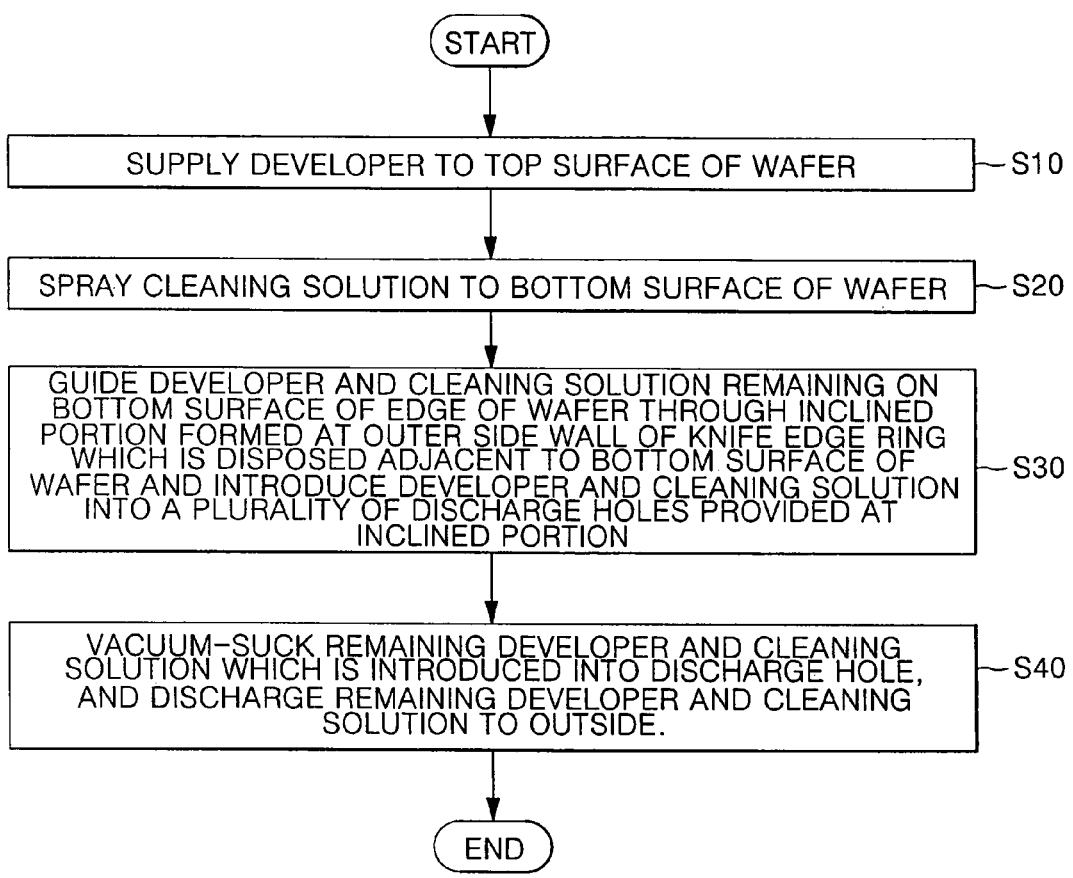
FIG. 5 is a flow chart illustrating an embodiment of a method of cleaning a bottom surface of a wafer using the semiconductor development apparatus according to the present invention.

A method of cleaning the bottom surface of a wafer using the semiconductor development apparatus in accordance with the present invention is described with reference to the flow chart of FIG. 5. Constituent elements for explaining the method of cleaning the bottom surface of the wafer are the same as that referenced in the above-described embodiments shown in FIGS. 1-4, and thus the detailed description thereof is omitted. Referring to FIGS. 4 and 5, chuck 190 on which wafer W is mounted rotates at a constant speed and is powered by an external power supply. A predetermined amount of developer is supplied to the top surface of the rotating wafer W from developer supply unit 500 at step S10. The supplied developer is uniformly spread on the top surface of wafer W. However, the developer supplied to the top surface of the edge of wafer W may be directed to the bottom surface of the wafer's edge by centrifugal force and forms a liquid droplet P. A cleaning solution is sprayed onto the bottom surface of rotating wafer W at step S20. In particular, the cleaning solution is sprayed onto the bottom surface of the edge of the wafer W at a predetermined angle of inclination under a predetermined spraying pressure. The cleaning solution cleans the bottom surface of wafer W and is directed to the bottom surface of the edge of wafer W through top surface of body 110. The cleaning solution combines with liquid droplet P of the developer and forms a large-sized liquid droplet P. At step S30, any remaining developer and cleaning solution on the bottom surface of the edge of wafer W is directed down inclined portion 113 provided at the outer side wall 110b of knife edge ring 100 and flows into the plurality of discharge holes 111 provided in inclined portion 113. Liquid droplet P may drop onto the top surface of inclined portion 113 by its own weight and flow from the top surface of inclined portion 113 and into discharge hole 111. In this manner, liquid droplet P flows through hole 111 and is discharged externally outside of body 110. At step S40, the droplet P and any remaining developer and cleaning solution may be pulled into discharge hole 111 through the use of vacuum suction supplied by suction unit 200 and discharged externally.

Figure 6:
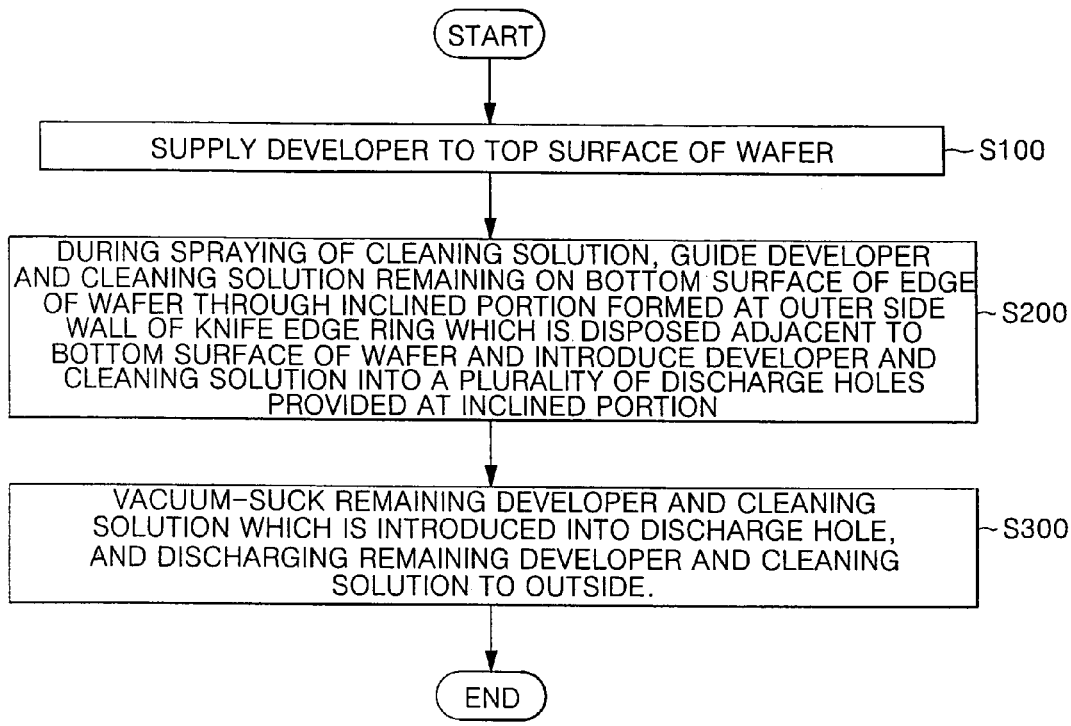
FIG. 6 is a flow chart illustrating another embodiment of a method of cleaning a bottom surface of a wafer using the semiconductor development apparatus of the present invention.

FIG. 6 is a flow chart illustrating an alternative method of cleaning the bottom surface of a wafer using the semiconductor development apparatus of the present invention. Referring to FIGS. 4 and 6, the developer is supplied onto the top surface of the wafer W at step S100. Cleaning solution is applied to the bottom surface of wafer W and any developer and/or cleaning solution remaining on the bottom surface of the wafer's edge flows down inclined portion 113 and into a plurality of discharge holes 111 provided at inclined portion 113 at step S200. At step S300, the developer and cleaning solution which flowed into the discharge hole 111 is discharged externally and any remaining developer and cleaning solution is pulled to the outside using vacuum suction and similarly discharged.

In particular, the vacuum suction force generated from vacuum suction unit 200 is applied to discharge hole 111. This suction force forcedly pulls liquid droplet P dropped onto the inclined portion 113 into discharge hole 111 and discharges it externally away from body 110. In this manner, when the vacuum suction force is applied to discharge hole 111, the suction force may be applied to the periphery of inlet 111a provided at the inclined portion 113 as well as to the bottom surface of the edge of wafer W. By utilizing vacuum suction unit 200 connected to discharge hole 111, easy cleaning of inclined portion 113 around inlet 111a and the bottom surface of the wafer's edge is achieved. Thus, liquid droplet P formed from the developer and the cleaning solution does not remain on the bottom surface of the wafer's edge, thereby avoiding contamination of the top surface of wafer W by vaporization of the liquid droplet P deposited onto the wafer's top surface even though a baking process is performed on wafer W.

Therefore, the liquid droplet of the developer and the liquid droplet of the cleaning solution formed on the bottom surface of a wafer's edge flows into a discharge hole and is discharged externally. Alternatively, the liquid droplet is forcedly pulled away from the wafer and discharged externally using a suction force. In this manner a compromised circuit pattern generated during the baking process of a semiconductor wafer caused by contamination of a liquid droplet remaining on the wafer's surface is easily prevented. As a result, a reduction in product losses due to a reduction in the amount of usable wafer and a decrease in product deficiencies during semiconductor fabrication is achieved.

What is claimed is:

1. A knife edge ring apparatus for manufacturing a semiconductor device comprising:
   a body positioned a predetermined distance from a bottom surface of a semiconductor wafer, said body defined by an inner side wall, an outer side wall, a top surface, and a bottom surface;
   a multi-stage inclined portion formed in the outer side wall and inclined from said top surface towards an outer edge of said bottom surface; and
   a plurality of discharge holes, each discharge hole in the plurality of discharge holes having an inlet facing the semiconductor wafer and positioned along said multi-stage inclined portion, and penetrating said body to terminate in an outlet, wherein an inside diameter of each discharge hole narrows towards the outlet,
   wherein the multi-stage inclined portion has a first inclined portion surrounding a central portion of the body and a second inclined portion connected to the first inclined portion, the inclination of the first inclined portion towards the second inclined portion being greater than the inclination of the second inclined portion towards the bottom surface,
   the plurality of discharge holes comprising:
      a first discharge hole disposed along the first inclined portion and having an inlet with an internal diameter corresponding to a width of a top surface of the first inclined portion, and
      a second discharge hole disposed along the second inclined portion and having an inlet formed by first and second inner side walls, wherein an inclination of the first inner side wall closer to the body is less than an inclination of the second inner side wall with respect to a central axis of the second discharge hole.

2. The apparatus according to claim 1, wherein a cross sectional area of the inlets of the first and second discharge holes are greater than a cross sectional area of the respective outlets of the first and second discharge holes.

3. The apparatus according to claim 1, wherein an angle formed between the first inclined portion and a second inclined portion is obtuse.

4. A knife edge ring apparatus for manufacturing a semiconductor device comprising:
   a body including a center hole, a first inclined region having a first discharge hole, and a second inclined region having a second discharge hole, the first inclined region disposed between the center hole and the second inclined region,
   wherein the first inclined region includes a first inclined surface and a first lower surface, the first discharge hole extending from the first inclined surface toward the first lower surface,
   wherein the second inclined portion includes a second inclined surface connected to the first inclined surface and a second lower surface continuing with the first lower surface, the second discharge hole extending from the second inclined surface toward the second lower surface,
   wherein the first inclined surface and the second inclined surface are declined toward the outside of the body, and the first inclined surface of the first inclined region is steeper than the second inclined surface of the second inclined region.

5. The apparatus according to claim 4, wherein an inside diameter of the first discharge hole narrows from the first inclined surface towards the first lower surface, and an inside diameter of the second discharge holes narrows from the second inclined surface towards the second lower surface.

6. The apparatus according to claim 4, wherein the body further includes a protrusion disposed between the center hole and the first discharge hole, wherein the protrusion extends from the first inclined surface toward a outer side of the body.

7. The apparatus according to claim 6, wherein the protrusion includes a upper surface and a lower surface, the lower surface inclines upward from the inside of the body toward the outside of the body.

* * * * *